US009488779B2

(12) United States Patent
Tseng et al.

(10) Patent No.: US 9,488,779 B2
(45) Date of Patent: Nov. 8, 2016

(54) APPARATUS AND METHOD OF FORMING LASER CHIP PACKAGE WITH WAVEGUIDE FOR LIGHT COUPLING

(71) Applicant: TAIWAN SEMICONDUCTOR MANUFACTURING COMPANY, LTD., Hsinchu (TW)

(72) Inventors: Chun-Hao Tseng, Taichung (TW); Ying-Hao Kuo, Hsinchu (TW); Kuo-Chung Yee, Taoyuan (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 155 days.

(21) Appl. No.: 14/076,519

(22) Filed: Nov. 11, 2013

(65) Prior Publication Data

US 2015/0131939 A1 May 14, 2015

(51) Int. Cl.
*G02B 6/138* (2006.01)
*G02B 6/12* (2006.01)

(52) U.S. Cl.
CPC ............ *G02B 6/138* (2013.01); *G02B 6/12004* (2013.01); *H01L 2224/18* (2013.01)

(58) Field of Classification Search
None
See application file for complete search history.

(56) References Cited

U.S. PATENT DOCUMENTS

| | | | | |
|---|---|---|---|---|
| 5,488,678 A * | 1/1996 | Taneya et al. | .................. | 385/14 |
| 5,521,992 A * | 5/1996 | Chun et al. | ..................... | 385/14 |
| 5,796,883 A * | 8/1998 | Hamamoto et al. | ............ | 385/14 |
| 6,040,590 A * | 3/2000 | OBrien et al. | .................. | 257/94 |
| 6,225,648 B1 * | 5/2001 | Hsieh et al. | ..................... | 257/95 |
| 6,330,378 B1 * | 12/2001 | Forrest et al. | .................. | 385/14 |
| 6,356,694 B1 * | 3/2002 | Weber | ........................... | 385/132 |
| 6,399,407 B1 * | 6/2002 | O'Brien et al. | ................ | 438/29 |
| 6,574,254 B1 * | 6/2003 | Wang | ............................... | 372/34 |
| 6,985,505 B2 * | 1/2006 | Nomoto et al. | ........... | 372/49.01 |
| 7,783,146 B2 * | 8/2010 | Blauvelt et al. | ............... | 385/50 |
| 7,843,982 B2 * | 11/2010 | Chua et al. | ................ | 372/49.01 |
| 8,003,426 B2 * | 8/2011 | Yee | ................................. | 438/68 |
| 8,680,647 B2 * | 3/2014 | Yu et al. | ....................... | 257/528 |
| 8,741,691 B2 * | 6/2014 | Yee et al. | ...................... | 438/108 |
| 8,787,417 B2 * | 7/2014 | Baets et al. | ................ | 372/45.01 |
| 8,809,996 B2 * | 8/2014 | Chen et al. | .................... | 257/528 |
| 8,828,484 B2 * | 9/2014 | Lai et al. | ...................... | 427/162 |
| 8,922,900 B2 * | 12/2014 | Tseng et al. | .................... | 359/642 |
| 8,942,269 B2 * | 1/2015 | Kasugai et al. | ........... | 372/44.01 |
| 8,976,833 B2 * | 3/2015 | Lai et al. | ................... | 372/50.23 |
| 9,036,956 B2 * | 5/2015 | Tseng et al. | .................... | 385/14 |
| 9,040,381 B2 * | 5/2015 | Yu et al. | ....................... | 438/381 |
| 9,041,015 B2 * | 5/2015 | Lai et al. | ......................... | 257/81 |
| 2003/0128907 A1 * | 7/2003 | Kikuchi et al. | ................ | 385/14 |
| 2004/0106224 A1 * | 6/2004 | Hamilton et al. | ............. | 438/31 |
| 2004/0121520 A1 * | 6/2004 | Karkkainen | .................. | 438/107 |
| 2004/0156096 A1 * | 8/2004 | Frolov et al. | .............. | 359/341.3 |
| 2005/0089262 A1 * | 4/2005 | Jenkins et al. | .................. | 385/14 |

(Continued)

*Primary Examiner* — Andrew Jordan
(74) *Attorney, Agent, or Firm* — Slater Matsil, LLP

(57) ABSTRACT

An apparatus and method of forming a chip package with a waveguide for light coupling is disclosed. The method includes depositing an adhesive layer over a carrier. The method further includes depositing a laser diode (LD) die having a laser emitting area onto the adhesive layer and depositing a molding layer over the LD die and the adhesive layer. The method still further includes curing the molding layer and partially removing the molding layer to expose the laser emitting area. The method also includes depositing a ridge waveguide structure adjacent to the laser emitting area and depositing an upper cladding layer over the ridge waveguide structure.

20 Claims, 5 Drawing Sheets

(56) References Cited

U.S. PATENT DOCUMENTS

| | | | |
|---|---|---|---|
| 2005/0207463 A1* | 9/2005 | Nomoto et al. | 372/43.01 |
| 2007/0153857 A1* | 7/2007 | Chua et al. | 372/49.01 |
| 2008/0089378 A1* | 4/2008 | Kamiyama et al. | 372/50.21 |
| 2009/0273094 A1* | 11/2009 | Ha et al. | 257/777 |
| 2010/0067559 A1* | 3/2010 | Inoue et al. | 372/50.121 |
| 2011/0044364 A1* | 2/2011 | Farrell et al. | 372/45.01 |
| 2013/0147472 A1* | 6/2013 | French et al. | 324/252 |
| 2013/0168805 A1* | 7/2013 | Yu et al. | 257/528 |
| 2013/0216177 A1* | 8/2013 | Tseng et al. | 385/14 |
| 2013/0223789 A1* | 8/2013 | Lee et al. | 385/14 |
| 2013/0277829 A1* | 10/2013 | Yee et al. | 257/737 |
| 2013/0313121 A1* | 11/2013 | Yu et al. | 205/123 |
| 2014/0001635 A1* | 1/2014 | Chen et al. | 257/751 |
| 2014/0021491 A1* | 1/2014 | Meng et al. | 257/82 |
| 2014/0070348 A1* | 3/2014 | Yee et al. | 257/432 |
| 2014/0073091 A1* | 3/2014 | Yu et al. | 438/124 |
| 2014/0084421 A1* | 3/2014 | Tseng et al. | 257/618 |
| 2014/0091326 A1* | 4/2014 | Tran et al. | 257/81 |
| 2014/0204466 A1* | 7/2014 | Tseng et al. | 359/642 |
| 2014/0206110 A1* | 7/2014 | Lee et al. | 438/16 |
| 2014/0206191 A1* | 7/2014 | Lee et al. | 438/694 |
| 2014/0212627 A1* | 7/2014 | Lai et al. | 428/172 |
| 2014/0231991 A1* | 8/2014 | Yee et al. | 257/737 |
| 2014/0269804 A1* | 9/2014 | Lai et al. | 372/50.21 |
| 2014/0295624 A1* | 10/2014 | Chen et al. | 438/126 |
| 2014/0355929 A1* | 12/2014 | Tseng et al. | 385/14 |
| 2014/0363121 A1* | 12/2014 | Lai et al. | 385/14 |
| 2014/0376858 A1* | 12/2014 | Lai et al. | 385/14 |
| 2015/0003773 A1* | 1/2015 | Klein et al. | 385/11 |
| 2015/0016793 A1* | 1/2015 | Lee et al. | 385/123 |
| 2015/0036970 A1* | 2/2015 | Lai et al. | 385/14 |
| 2015/0036991 A1* | 2/2015 | Lai et al. | 385/132 |
| 2015/0061126 A1* | 3/2015 | Lee et al. | 257/738 |
| 2015/0061137 A1* | 3/2015 | Lee et al. | 257/758 |
| 2015/0104909 A1* | 4/2015 | Lai et al. | 438/127 |
| 2015/0108667 A1* | 4/2015 | Lai et al. | 257/787 |
| 2015/0115464 A1* | 4/2015 | Yu et al. | 257/774 |
| 2015/0130045 A1* | 5/2015 | Tseng et al. | 257/712 |
| 2015/0130047 A1* | 5/2015 | Tseng et al. | 257/713 |
| 2015/0131089 A1* | 5/2015 | Lai et al. | 356/300 |
| 2015/0131938 A1* | 5/2015 | Tseng et al. | 385/14 |
| 2015/0131939 A1* | 5/2015 | Tseng et al. | 385/14 |
| 2015/0132008 A1* | 5/2015 | Kuo et al. | 398/135 |
| 2015/0145082 A1* | 5/2015 | Lee et al. | 257/432 |
| 2015/0146203 A1* | 5/2015 | Lai et al. | 356/330 |
| 2015/0146268 A1* | 5/2015 | Huang et al. | 358/475 |
| 2015/0146275 A1* | 5/2015 | Lee et al. | 359/245 |
| 2015/0147852 A1* | 5/2015 | Huang et al. | 438/127 |
| 2015/0155260 A1 | 6/2015 | Lee et al. | |
| 2015/0160413 A1 | 6/2015 | Kuo et al. | |
| 2015/0168659 A1 | 6/2015 | Lai et al. | |
| 2015/0170990 A1 | 6/2015 | Tseng et al. | |
| 2015/0180210 A1 | 6/2015 | Yu et al. | |

* cited by examiner

APPARATUS AND METHOD OF FORMING LASER CHIP PACKAGE WITH WAVEGUIDE FOR LIGHT COUPLING

BACKGROUND

Semiconductor chip packages such as planar lightwave circuits (PLCs) are used in a variety of applications including wavelength division multiplexing (WDM) based optical networks to provide voice, data and broadcast services. PLCs have a waveguide structure in which light from a semiconductor laser diode can propagate, split and recombine. The waveguide structure for guiding light includes a core layer in which light propagates and a cladding layer encompassing the core layer and having an index of refraction greater than that of the core layer. In some cases the refractive index of the core layer is larger than the refractive index of the clad layer by 0.025 and results in total reflection during light transportation. PLCs are used as an optical power distributor, a wavelength splitting/combining filter, an optical switch using a thermo-optic effect, a variable optical attenuator, and a wavelength variable filter. PLCs often have a small device size and are compatible with a semiconductor process. PLC device manufacturers are continually challenged to reduce costs while increasing quality and reliability.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are examples and are not intended to be limiting.

Waveguides are used to control a propagation of light from one element to another element. Waveguides are used in image sensors, optical communications, opto-electric circuits, spectrum analysis devices as well as other technologies. Some planar lightwave circuits (PLCs) direct light into waveguide structures using optical coupling techniques such as gratings or micro-lenses. Directing light using gratings or micro-lenses, for example, often necessitates stringent process control and/or active alignment to achieve desired precision, all at considerable expense. Additionally, some PLCs that use gratings, for example, have limited available incident angles for receiving light from a light source such as a laser diode that is often positioned a particular distance above the applicable waveguide structure. Placement of a light source above the applicable waveguide structure increases the amount of space occupied by some chip packages.

Figure 1:
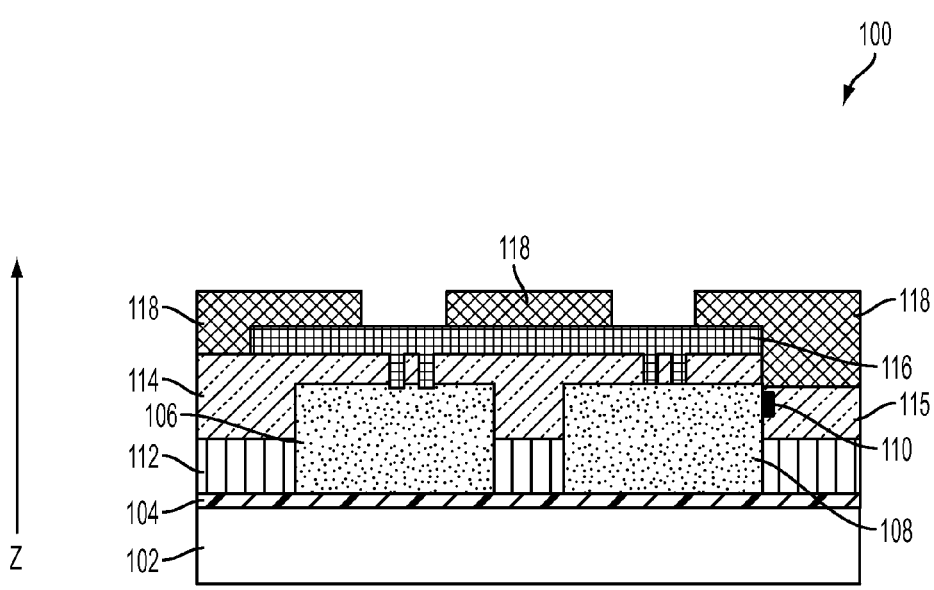
FIG. 1 is a cross-sectional view of a chip package with a waveguide for light coupling, in accordance with one or more embodiments.

FIG. 1 is a cross-sectional view of a chip package 100 with a waveguide for light coupling, in accordance with one or more embodiments. Chip package 100 includes a carrier 102. An adhesive layer 104 is over the carrier 102. An integrated circuit (IC) die 106 and a laser diode (LD) die 108 are on the adhesive layer 104. The LD die contains a laser emitting area 110.

In at least some embodiments, adhesive layer 104 is deposited over carrier 102. In at least some embodiments, IC die 106 and LD die 108 are deposited on the adhesive layer 104.

A molding compound layer 112 is over the adhesive layer 104, the IC die 106 and the LD die 108. In at least some embodiments, molding compound layer 112 is deposited over the adhesive layer 104, the IC die 106 and the LD die 108. In at least some embodiments, the molding compound layer 112 is cured and partially removed by a mechanical grinding process to expose the laser emitting area 110, a top surface of the IC die 106 and a top surface of the LD die 108. The molding compound layer 112 secures the IC die 106 and LD die 108 in place and is a lower cladding layer.

A waveguide layer 114 is over the molding compound layer 112, the IC die the laser emitting area 110, the top surface of the IC die 106 and the top surface of the LD die 108. In at least some embodiments, waveguide layer 114 is deposited over the molding compound layer 112, the IC die 106, the laser emitting area 110, the top surface of the IC die 106 and the top surface of the LD die 108. In at least some embodiments, the waveguide layer 114 is patterned by photolithographic techniques, such as etching, to produce vias 117 (FIG. 3D) above the top surface of the IC die 106 and the top surface of the LD die 108, and an opening above a ridge waveguide structure 115.

A redistribution layer 116 (RDL) is over waveguide layer 114 and in the vias 117 in the waveguide layer to communicatively contact the IC die 106 and the LD die 108. In at least some embodiments, redistribution layer 116 (RDL) is deposited over waveguide layer 114 and in the vias 117 in the waveguide layer to communicatively contact the IC die 106 and the LD die 108.

An upper cladding layer 118 is over the waveguide layer 114 and the redistribution layer 116. In at least some embodiments, upper cladding layer 118 is deposited over the waveguide layer 114 and the redistribution layer 116. In at least some embodiments, the upper cladding layer 118 is patterned by photolithographic techniques. In some embodiments, the waveguide layer 114, molding compound layer 112 and upper cladding layer are dielectric materials selected from spin-on glass (SOG), spin-on dielectric (SOD), photosensitive polymers, and the like, that are patterned by photolithography processes, such as etching.)

Figure 2:
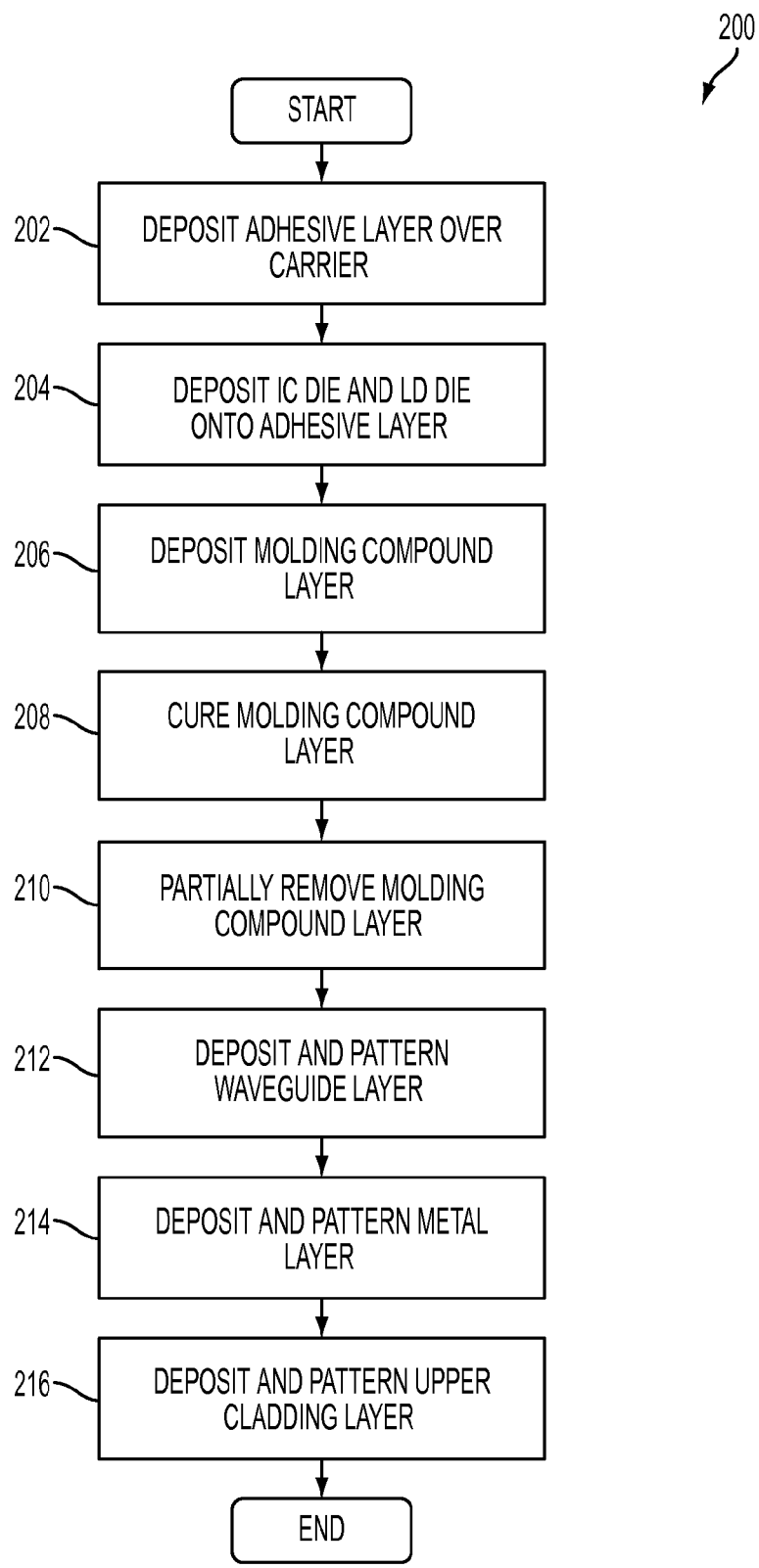
FIG. 2 is a flowchart of a process associated with forming a chip package with a waveguide for light coupling, in accordance with one or more embodiments.

FIG. 2 is a flowchart of a method 200 associated with forming a chip package with a waveguide for light coupling, in accordance with one or more embodiments. It is understood that additional processes are not precluded from being performed before, during, and/or after the method 200.

In operation 202, an adhesive layer, e.g., adhesive layer 104, is deposited over a carrier, e.g., carrier 102. In some embodiments, the carrier is made of a polymer. In some embodiments, the carrier is a silicon wafer. In some embodiments, the carrier is selected from glass, ceramic, metal, polymer or other suitable materials. The adhesive layer adheres to the carrier. In some embodiments, the adhesive layer is not releasable. In some embodiments, the adhesive layer is a double-sided tape having an adhesive substance on a top side and an adhesive substance on a bottom side. In some embodiments, the adhesive layer is one or more of a polymer, a gel, or other suitable materials applied by any of a roller, a lamination process, a spin coat, and the like. In some embodiments, the adhesive layer is treated to eliminate any bubbling that is present resulting from formation of the adhesive layer.

In operation 204, an integrated circuit (IC) die, e.g., IC die 106, and a laser diode (LD) die, e.g., LD die 108, are deposited onto the adhesive layer. The IC die and the LD die are electrically coupled together. One or more circuits on the IC die electrically control the laser diode LD die. In some embodiments, the LD die is deposited face-up, i.e., having a laser emitting area closer to a top surface of the LD die than a bottom surface of the LD die. In some embodiments, the IC die is not deposited onto the carrier. In some embodiments, the IC die and the LD die include silicon substrates and/or type III-V substrates.

Figure 3A:
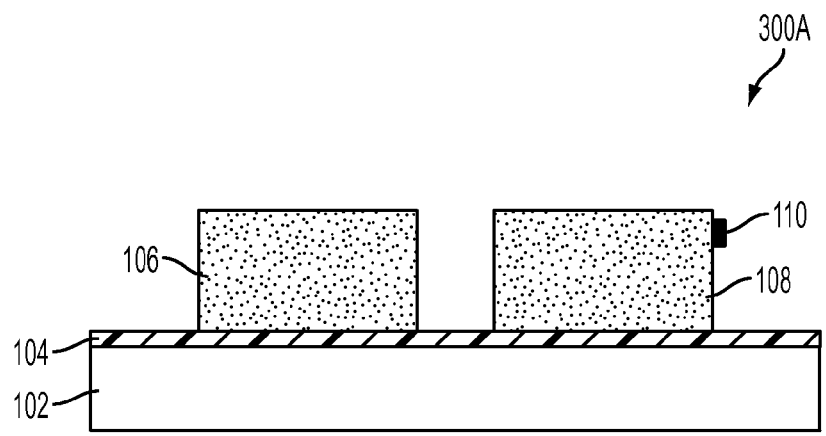
FIGS. 3A-3F are cross-sectional views of a chip package with a waveguide for light coupling at various stages of production, in accordance with one or more embodiments.

FIG. 3A is a cross-sectional view of a chip package 300A with a waveguide for light coupling following operation 202 and operation 204, in accordance with one or more embodiments. The adhesive layer is deposited onto the carrier. The IC die and the LD die with a laser emitting area, e.g., laser emitting area 110, are deposited onto the adhesive layer. The LD die is face-up on the adhesive layer.

In operation 206, a molding compound layer is deposited over the adhesive layer, the IC die and the LD die. In some embodiments, the molding compound layer is provided in liquid form. In other embodiments, the molding compound layer is provided in a sheet form by a thermal compression or lamination process.

In operation 208, the molding compound layer is subjected to a curing process that hardens or solidifies the molding compound layer. In at least some embodiments, the curing process reduces a coefficient of thermal expansion (CTE) to a CTE close to that of the IC die and the LD die. Curing the molding compound layer also secures the LD die in a selected position over the carrier.

In some embodiments, the molding compound is a polymer composite. In some embodiments, the molding compound is an epoxy resin. In some embodiments, the molding compound is an epoxy silica. In some embodiments, pressure is applied to the molding compound during the curing process. The molding compound layer, in some embodiments, is provided at a temperature in a range from about 100° C. to about 150° C. for a period of time from approximately 1 to 10 minutes. In some embodiments, the curing process occurs in a temperature range from about 100° C. to about 200° C. for a period of time from approximately 1 to 5 hours. The curing process, in some embodiments, occurs at any temperature and for any duration of time that is sufficient to cure the molding compound layer.

Figure 3B:
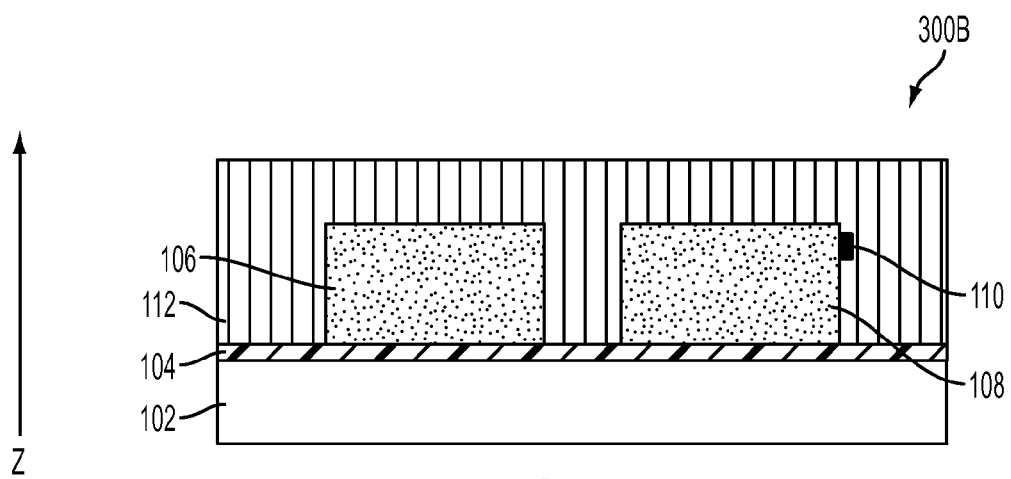

FIG. 3B is a cross-sectional view of a chip package 300B with a waveguide for light coupling following operation 206 and operation 208, in accordance with one or more embodiments. A molding compound layer, e.g., molding compound layer 112, is deposited onto the adhesive layer, the IC die and the laser diode LD die. The molding compound layer is cured.

In operation 210, the molding compound layer is partially removed to reveal a top surface of the IC die, the top surface of the LD die and the laser emitting area. The molding compound layer is partially removed by a mechanical grinding process. In some embodiments, the molding compound layer is partially removed by etching, such as dry etching. In some embodiments, the molding compound layer is partially removed by cutting, such as laser cutting or mechanical cutting. The molding compound layer also functions as a lower cladding layer to further limit the number of processes for fabricating the chip package 100. In some embodiments, the molding compound layer is configured to minimize light absorption. For example, in one or more embodiments, the molding compound layer is configured to exclude carbon black additives, opaque particles and opaque compounds.

Figure 3C:
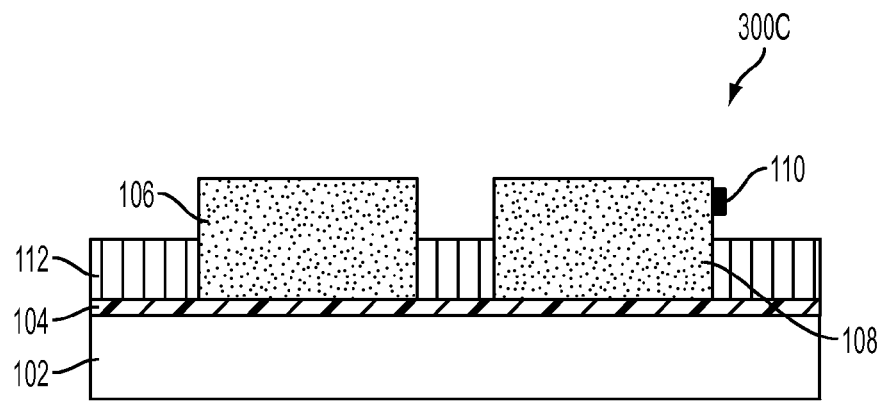

FIG. 3C is a cross-sectional view of a chip package 300C with a waveguide for light coupling following operation 210, in accordance with one or more embodiments. Molding compound layer is partially removed to reveal the top surface of the IC die, the top surface of the LD die and the laser emitting area In an embodiment, the molding compound layer is partially removed to further reveal the laser emitting area on a side of the LD die that is substantially perpendicular to a major surface of the adhesive layer.

In operation 212, a waveguide layer, e.g., waveguide layer 114, is deposited onto the molding layer, the IC die and the LD die, and patterned to create vias in the waveguide layer above the top surface of the IC die and the top surface of the LD die, and to create a ridge waveguide structure, e.g., ridge waveguide structure 115. In some embodiments, the waveguide layer comprises polyimide, epoxy, polymer, dielectric material, or other suitable material. In some embodiments, the waveguide layer is formed by a spin coat or deposition process. The waveguide layer is etched by photolithographic techniques to produce vias above the IC die and above the LD die and to produce an opening above the ridge waveguide structure. The ridge waveguide structure is adjacent and optically coupled to the laser emitting area of the LD die.

In some embodiments, the ridge waveguide structure is formed separately from the waveguide layer. For example, in some embodiments, an etching, cutting or grinding process removes a portion of the waveguide layer and the ridge waveguide structure is formed within a space made available by removing the portion of the waveguide layer in a level associated with the waveguide layer.

Figure 3D:
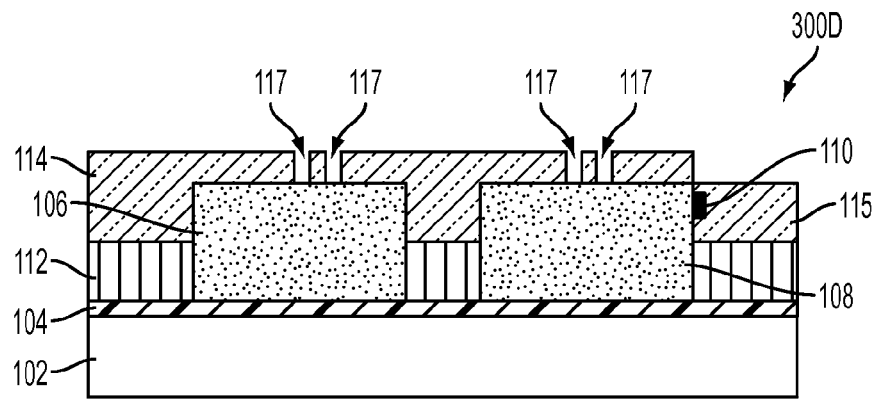

FIG. 3D is a cross-sectional view of a chip package 300D with a waveguide for light coupling following operation 212, in accordance with one or more embodiments. The waveguide layer is deposited over the molding compound layer, the top surface of the IC die and the top surface of the LD die. The laser emitting area of the LD die is adjacent and optically coupled to the ridge waveguide structure in the waveguide layer. The waveguide layer has one or more vias, e.g., vias 117, to enable one or more electrical connections to the IC die and/or the LD die.

In operation 214, a redistribution layer, e.g., redistribution layer 116, is deposited and patterned over the waveguide layer and into the vias in the waveguide layer. The redistribution layer is coupled to the chip package portion by way of the one or more vias. In some embodiments, the redistribution layer is formed by an electrochemical plating (ECP) processes and photolithography. In some embodiments, the redistribution layer includes a conductive material such as, but not limited to, copper, aluminum, gold, silver. In some embodiments, a non-metal conductor, such as a conductive polymer, is substituted for metal in the redistribution layer.

Figure 3E:
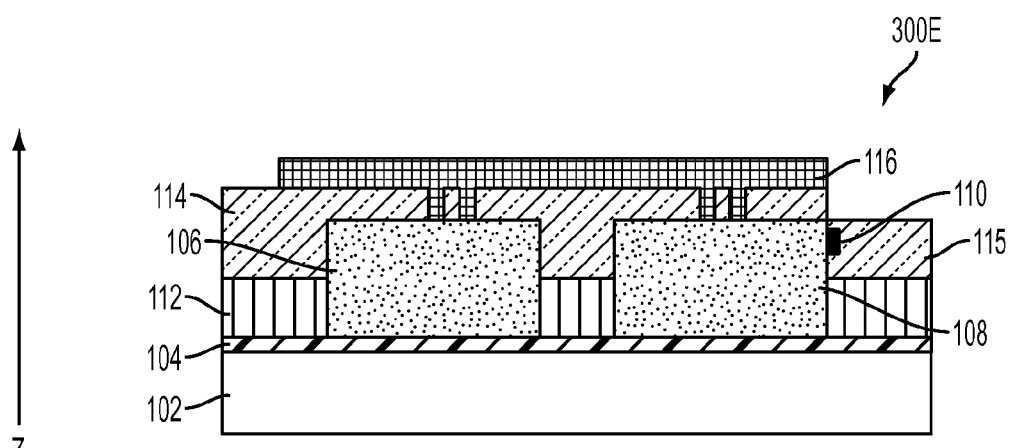

FIG. 3E is a cross-sectional view of a chip package 300E with a waveguide for light coupling following operation 214, in accordance with one or more embodiments. The redistribution layer is deposited and patterned over the waveguide layer and into the vias in the waveguide layer. In an embodiment, the redistribution layer extends through the waveguide layer to contact to the IC die and the LD die. In an embodiment, the redistribution layer is disposed between the waveguide layer and the LD die along a line perpendicular to an upper surface of the LD die.

In operation 216, an upper cladding layer, e.g., upper cladding layer 118, is deposited and patterned over the waveguide layer and the redistribution layer. The upper cladding layer, in some embodiments, includes a polymer and/or dielectric material that is spin coated or deposited to overlay the waveguide layer, including the ridge waveguide structure in the waveguide layer, and the redistribution layer. In some embodiments, the lower cladding layer formed by the molding compound layer, the ridge waveguide structure formed in the waveguide layer and the upper cladding layer together, form a waveguide for coupling light from the LD die. In some embodiments, the upper cladding layer covers one or more sidewall portions of the ridge waveguide structure. In some embodiments the upper cladding layer also functions as a passivation layer for the redistribution layer.

Figure 3F:
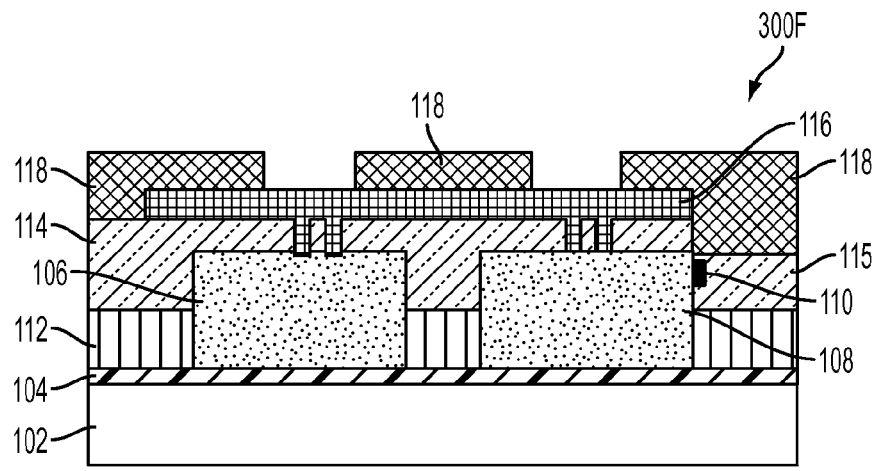

FIG. 3F is a cross-sectional view of a chip package 300F with a waveguide for light coupling following operation 216, in accordance with one or more embodiments. The upper cladding layer is deposited and patterned over the waveguide layer, the ridge waveguide structure and the redistribution layer. The chip package 300F is configured to emit a light from the light emitting area of the LD die through the ridge waveguide structure in the waveguide layer. In some embodiments, the ridge waveguide structure is radially surrounded by the molding layer that functions as a lower cladding and the upper cladding layer. Because ridge waveguide structure is formed after the LD is held in place, no additional alignment devices or procedures are required, thereby producing cost savings and improved quality.

Figure 4:
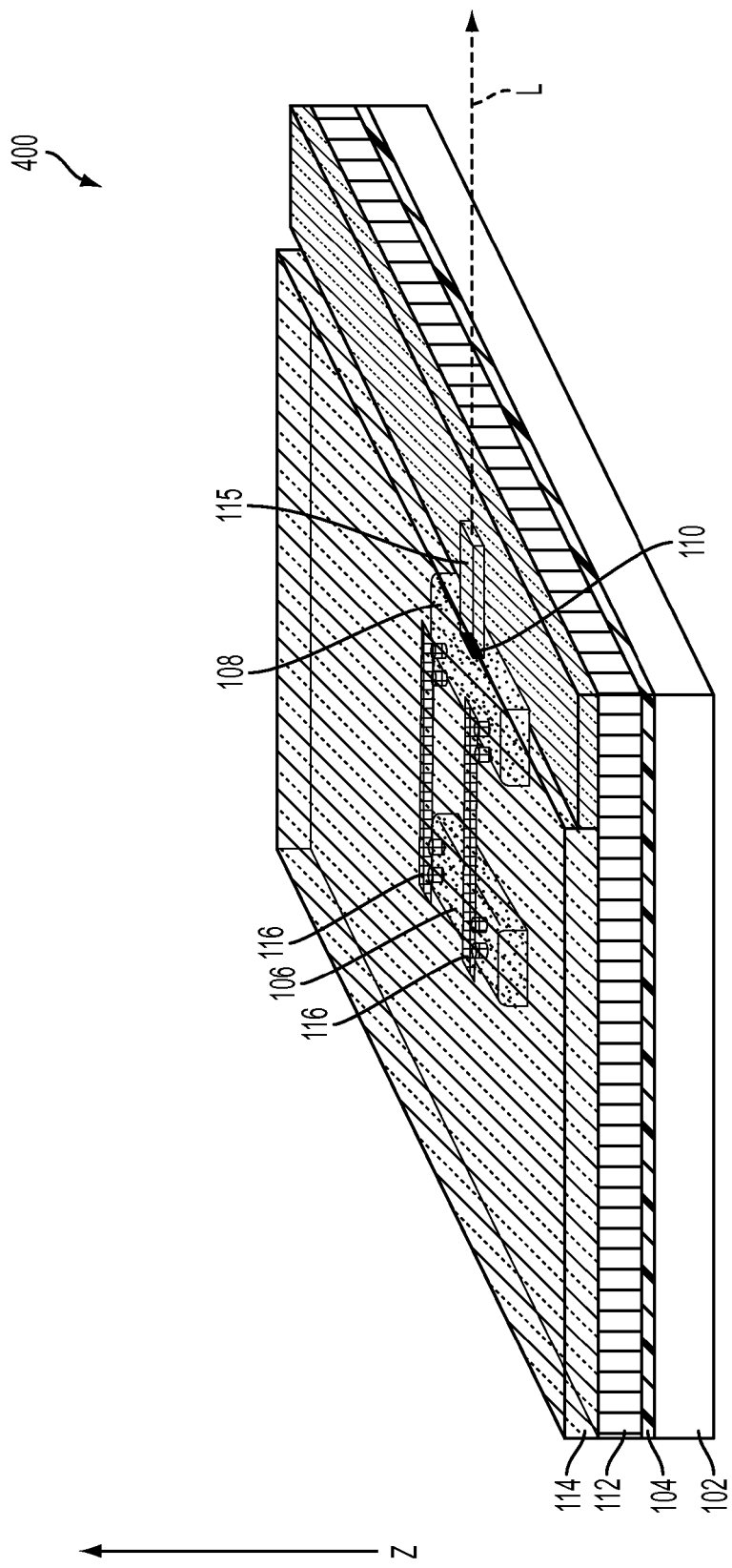
FIG. 4 is an isometric view of a chip package with a waveguide for light coupling, in accordance with one or more embodiments.

FIG. 4 is an isometric view of a chip package 400 with a waveguide for light coupling, in accordance with one or more embodiments. The adhesive layer 104 is deposited over the carrier 102. The integrated circuit (IC) die 106 and a laser diode (LD) die 108 are deposited onto the adhesive layer 104. The LD die contains a laser emitting area 110.

The molding compound layer 112 is deposited over the adhesive layer 104, the IC die 106 and the LD die 108. The molding compound layer 112 is partially removed by a mechanical grinding process to expose the laser emitting area 110 and the top surface of the IC die 106 and the top surface of the LD die 108. The molding compound layer 112 is also a lower cladding layer. The waveguide layer 114 is deposited over the molding compound layer 112, the IC die the laser emitting area 110, the top surface of the IC die 106 and the top surface of the LD die 108. The waveguide layer 114 is patterned by photolithographic techniques, such as etching, to produce vias 117 (FIG. 3D) above the top surface of the IC die 106 and the top surface of the LD die 108, and the opening above the ridge waveguide structure 115. The redistribution layer 116 is deposited over waveguide layer 114 and in the vias 117 in the waveguide layer to contact the IC die 106 and the LD die 108. Similar to FIG. 3F, the upper cladding layer 118 is deposited over the waveguide layer 114 and the redistribution layer 116. The upper cladding layer 118 is patterned by photolithographic techniques.

If electrical power is transmitted through the redistribution layer 116 to the IC die 106 and LD die 108, laser light L is emitted from the light emitting area 110 of the LD die 108. The laser light L propagates from the light emitting area 110 through the ridge waveguide structure 115 formed in the waveguide layer 114 and emerges from the chip package 400 as illustrated in FIG. 4. Accordingly, in some embodiments, accurate positional control of the LD die 108 in the chip package 400 is achieved because the ridge waveguide structure 115 is formed after the LD 108 is secured in place relative to the carrier 102 by the adhesive layer 104 and the molding layer 112, and partial removal of the molding compound layer 112, such as by grinding or etching, is controllable, therefore, the LD emitting area exposed is controlled in the Z-direction, and subsequently optically coupled with the waveguide layer 114.) Thus, in at least some embodiments, no additional costly alignment devices or time-consuming alignment procedures are required, resulting in cost savings and improved quality, among other advantages.

In some embodiments, the LD 108 is operated in a single frequency mode (single mode) and the ridge waveguide structure has a thickness along the z axis from about 1 micrometer to about 10 micrometers. In some embodiments, the LD 108 is operated in a multiple frequency mode (multi-mode) and the ridge waveguide structure has a thickness along the z axis from about 10 micrometers to about 100 micrometers.

In some embodiments, a refractive index difference between one or more of the upper cladding layer 118, the molding compound layer 112 and the ridge waveguide structure 115 is greater than about 0.025. In some embodiments, the refractive index difference is determined based on light emission of a "sodium D-line" wavelength. In one or more embodiments, the refractive index difference is based on a selected light emission having a wavelength other than a sodium D-line wavelength.

In some embodiments, the chip package 400 has an overall thickness the same as the thickness of the IC die 106 and/or the LD die 108. In some embodiments, the chip package 400 has an overall thickness different from the thickness of the IC die 106 and/or the LD die 108. The waveguide layer 114 in the chip package 400 results in a chip package 400 that has a reduced thickness in the z-direction compared to planar lightwave circuits (PLCs) that include a light source positioned above an optical grating. The chip package 400 having the ridge waveguide structure 115 formed in the waveguide layer 114, accordingly, enables a reduction in chip package size.

One aspect of this description relates to a method of forming a chip package with a waveguide for light coupling. The method comprises depositing an adhesive layer over a carrier and depositing a laser diode (LD) die having a laser emitting area onto the adhesive layer. The method further comprises depositing a molding layer over LD die and the adhesive layer and curing the molding layer. The method still further comprises partially removing the molding layer to expose the laser emitting area, depositing a ridge waveguide structure adjacent to the laser emitting area and depositing an upper cladding layer over the ridge waveguide structure.

Another aspect of this description relates to a chip package with a waveguide for light coupling. The waveguide comprises a carrier, an adhesive layer over a carrier and a laser diode (LD) die having a laser emitting area in contact with the adhesive layer. The waveguide further comprises a molding layer over the adhesive layer and around the LD die, the molding layer not covering the laser emitting area. The apparatus still further comprises a ridge waveguide structure adjacent to the laser emitting area and an upper cladding layer over the ridge waveguide structure.

Still another aspect of this description relates to a method of forming a chip package with a waveguide for light coupling. The method comprises depositing an adhesive layer over a carrier and depositing a laser diode (LD) die having a laser emitting area onto the adhesive layer. The method also comprises depositing an integrated circuit (IC) communicatively coupled to the laser diode (LD) onto the adhesive layer and depositing a molding layer over LD die, the ID die and the adhesive layer. The method further comprises curing the molding layer and partially removing the molding layer to expose a top surface of the LD die, a top surface of the IC die and the laser emitting area. The method additionally comprises depositing a waveguide layer over the molding layer and LD die and partially removing the waveguide layer to form the ridge waveguide structure. The method further comprises depositing a redistribution layer over the LD die and depositing an upper cladding layer over the ridge waveguide structure.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A method of forming a chip package with a waveguide for light coupling, comprising:
   depositing an adhesive layer over a carrier;
   depositing a laser diode (LD) die having a laser emitting area onto the adhesive layer;
   depositing a molding layer over the LD die and the adhesive layer;
   curing the molding layer;
   partially removing the molding layer to expose the laser emitting area on a side of the LD die that is substantially perpendicular to a major surface of the adhesive layer;
   depositing a ridge waveguide structure adjacent to the laser emitting area; and
   depositing an upper cladding layer over the ridge waveguide structure.

2. The method of claim 1, further comprising:
   depositing a redistribution layer over the LD die prior to depositing the upper cladding layer over the ridge waveguide structure.

3. The method of claim 1, wherein depositing the ridge waveguide structure adjacent to the laser emitting area further comprises:
   depositing a waveguide layer over the molding layer and LD die; and
   partially removing the waveguide layer to form the ridge waveguide structure.

4. The method of claim 1, wherein depositing a ridge waveguide structure adjacent to the laser emitting area further comprises:
   depositing a waveguide layer over the molding layer and LD die; and forming at least one via in the waveguide layer.

5. The method of claim 1, further comprising:
   depositing an integrated circuit (IC) die communicatively coupled to the LD die onto the adhesive layer.

6. The method of claim 1, wherein the LD die is deposited face-up.

7. The method of claim 1, wherein curing the molding layer secures the LD die in a selected position over the carrier.

8. The method of claim 1, wherein the molding layer is configured to reduce light absorption.

9. The method of claim 1, wherein a refractive index difference between one or more of the upper cladding layer, the molding layer and the ridge waveguide structure is greater than or equal to 0.025.

10. The method of claim 1, wherein the LD die is single mode and the ridge waveguide structure has a thickness ranging from 1 micrometer to 10 micrometers.

11. The method of claim 1, wherein the LD is multi-mode and the ridge waveguide structure has a thickness ranging from 10 micrometers to wo micrometers.

12. A chip package with a waveguide for light coupling, comprising:
    an adhesive layer over a carrier;
    a laser diode (LD) die having a laser emitting area in contact with and being on the adhesive layer;
    a molding layer over the adhesive layer and around the LD die, the molding layer not covering the laser emitting area;
    a ridge waveguide structure adjacent to the laser emitting area, wherein the ridge waveguide structure is disposed in a waveguide layer; and
    an upper cladding layer over the waveguide layer, wherein the waveguide layer is disposed between an upper surface of the LD die and the upper cladding layer along a line perpendicular to the upper surface of the LD die.

13. The chip package of claim 12, further comprising:
    a redistribution layer between the LD die and the upper cladding layer.

14. The chip package of claim 13, wherein the redistribution layer is disposed between the waveguide layer and the LD die along the line perpendicular to the upper surface of the LD die.

15. The chip package of claim 12, wherein the waveguide layer further comprises at least one via.

16. The chip package of claim 12, further comprising:
    an integrated circuit (IC) die communicatively coupled to the LD die on the adhesive layer.

17. The chip package of claim 12, wherein the molding layer secures the LD die in a selected position over the carrier.

18. The chip package of claim 12, wherein the molding layer is configured to reduce light absorption.

19. The chip package of claim 12, wherein a refractive index difference between one or more of the upper cladding layer, the molding layer and the ridge waveguide structure is greater than or equal to 0.025.

20. A method of forming a chip package with a waveguide for light coupling, comprising:
    depositing an adhesive layer over a carrier;
    depositing a laser diode (LD) die having a laser emitting area onto the adhesive layer;
    depositing an integrated circuit (IC) die communicatively coupled to the laser diode (LD) onto the adhesive layer;

depositing a molding layer over the LD die, the IC die and the adhesive layer;

curing the molding layer;

partially removing the molding layer to expose a top surface of the LD die, a top surface of the IC die, and the laser emitting area on a side of the LD die substantially perpendicular to a major surface of the adhesive layer;

depositing a waveguide layer over the molding layer and the LD die;

partially removing the waveguide layer to form a ridge waveguide structure;

depositing a redistribution layer over the IC die and the LD die, the redistribution layer extending through the waveguide layer to contact the IC die and the LD die; and depositing an upper cladding layer over the ridge waveguide structure.

* * * * *